US009297853B2

(12) United States Patent
Benoit et al.

(10) Patent No.: US 9,297,853 B2
(45) Date of Patent: Mar. 29, 2016

(54) IN-LINE MEASUREMENT OF TRANSISTOR DEVICE CUT-OFF FREQUENCY

(71) Applicant: International Business Machines Corporation, Armonk, NY (US)

(72) Inventors: John J. Benoit, Williston, VT (US); Panglijen Candra, Essex Junction, VT (US); Peng Cheng, Essex Junction, VT (US); Blaine Jeffrey Gross, Essex Junction, VT (US); Vibhor Jain, Essex Junction, VT (US); John R. Long, Essex Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 373 days.

(21) Appl. No.: 13/920,148

(22) Filed: Jun. 18, 2013

(65) Prior Publication Data
US 2014/0368227 A1 Dec. 18, 2014

(51) Int. Cl.
*G01R 31/3187* (2006.01)
*G01R 31/28* (2006.01)
*H01L 21/66* (2006.01)
*G01R 31/26* (2014.01)

(52) U.S. Cl.
CPC ........ *G01R 31/2884* (2013.01); *G01R 31/2612* (2013.01); *H01L 22/14* (2013.01)

(58) Field of Classification Search
CPC ... G01R 1/2884; G01R 1/3004; G01R 1/2889
See application file for complete search history.

(56) References Cited

U.S. PATENT DOCUMENTS

| 4,052,645 | A | * | 10/1977 | Fujita | 315/388 |
|---|---|---|---|---|---|
| 4,961,007 | A | * | 10/1990 | Kumanoya et al. | 327/537 |
| 5,027,064 | A | * | 6/1991 | Cripps | 324/762.09 |
| 5,404,109 | A | * | 4/1995 | Pribble et al. | 324/603 |
| 6,448,754 | B1 | | 9/2002 | Ihs et al. | |
| 6,681,193 | B2 | * | 1/2004 | Dallavalle | 702/117 |
| 6,777,921 | B2 | | 8/2004 | Abdennadher et al. | |
| 7,053,708 | B2 | * | 5/2006 | Nagamori et al. | 330/133 |
| 7,069,525 | B2 | | 6/2006 | Bhushan et al. | |
| 7,085,658 | B2 | | 8/2006 | Bhushan et al. | |
| 7,428,683 | B2 | | 9/2008 | Dai et al. | |
| 7,688,058 | B2 | | 3/2010 | Jenkins et al. | |
| 2008/0116910 | A1 | * | 5/2008 | Hung | 324/754 |
| 2011/0187400 | A1 | | 8/2011 | Watanabe | |
| 2012/0126821 | A1 | * | 5/2012 | Forstner | 324/537 |
| 2012/0182031 | A1 | * | 7/2012 | Tokumoto et al. | 324/750.01 |
| 2012/0194265 | A1 | | 8/2012 | Katsube et al. | |

(Continued)

*Primary Examiner* — Tung X Nguyen
*Assistant Examiner* — Dominic Hawkins
(74) *Attorney, Agent, or Firm* — Gibb & Riley, LLC; Anthony J. Canale

(57) ABSTRACT

A test circuit within a semiconductor wafer that measures a cut-off frequency for a transistor device under test may include a radio frequency source, located within a region of the wafer, that generates a radio frequency signal. A biasing circuit, also located within the region, may provide a current bias setting to the transistor device under test. The biasing circuit receives the radio frequency signal and applies a buffered radio frequency signal to the transistor device under test. The biasing circuit generates a buffered output signal based on the transistor device under test generating a first output signal in response to receiving the applied buffered radio frequency signal. An rf power detector, within the region, receives the first output signal and the radio frequency signal, and generates an output voltage signal, wherein the cut-off frequency of the transistor device under test is determined from the generated output voltage signal.

20 Claims, 5 Drawing Sheets

(56) References Cited

U.S. PATENT DOCUMENTS

2013/0082731 A1* 4/2013 Lou et al. ............... 324/762.01
2013/0116945 A1* 5/2013 Forrest et al. ................ 702/58
2013/0169363 A1* 7/2013 Chen et al. .................. 330/261
2014/0081586 A1* 3/2014 Boglione ..................... 702/69

* cited by examiner

IN-LINE MEASUREMENT OF TRANSISTOR DEVICE CUT-OFF FREQUENCY

BACKGROUND

Background of Invention

The present invention generally relates to semiconductor device testing, and more particularly, to device characteristic testing during manufacturing processes.

Performance parameters may be of paramount importance to customers of manufactured semiconductor devices. For example, from among various transistor metrics, cut-off frequency ($f_T$) is of great importance. The cut-off frequency ($f_T$) may generally be defined as the frequency at which the current gain (i.e., β) of the NPN transistor is unity (i.e., 0 dB on a logarithmic scale). For example, a NPN transistor may have a current gain of β=500 at DC and over a finite range of operating frequencies. As the operating frequency of the NPN transistor increases beyond this finite range, the current gain value starts to roll-off until it eventually reaches a value of β=1 at $f_T$. In essence, the $f_T$ frequency may be considered a measure of the speed limitation of the transistor device.

Current methods of measuring the $f_T$ frequency may require expensive external off-chip analyzer and probing equipment for testing semiconductor devices on a wafer and, thus, only a limited number of devices may be tested. Further, $f_T$ frequency determinations are most often made during the development phase as opposed to during the manufacturing process production phase, where $f_T$ variation could go undetected as long as other device parameters remained in an acceptable range.

It may, therefore, be desirable, among other things, to provide enhanced in-line $f_T$ frequency testing for semiconductor devices.

BRIEF SUMMARY

According to at least one exemplary embodiment, a test circuit within a semiconductor wafer that measures a cut-off frequency for a transistor device under test (DUT) is provided. The test circuit may include a region of the semiconductor wafer and a radio frequency signal source circuit that is also located within the region, whereby the radio frequency oscillator circuit generates a radio frequency signal. The test circuit may also include a biasing circuit, located within the region, which provides a current bias setting to the transistor device under test, whereby the biasing circuit receives the radio frequency signal and applies a buffered radio frequency signal to the transistor device under test. The biasing circuit generates a buffered output signal based on the transistor device under test generating a first output signal in response to receiving the applied buffered radio frequency signal. An rf power detector, also located within the region, may receive the first output signal and the radio frequency signal, and generate an output voltage signal such that the cut-off frequency of the transistor device under test is determined from the generated output voltage signal.

According to at least one other exemplary embodiment, a method of determining cut-off frequency for a transistor device within a semiconductor wafer may include forming a transistor device within a region of the semiconductor wafer and biasing the transistor device for enabling a substantially linear amplification. A radio frequency signal having a frequency value is applied to the biased transistor device to generate an amplified radio frequency signal. The radio frequency signal is also applied to a power convertor for converting the radio frequency signal into a first DC voltage. The radio frequency signal and the amplified radio frequency signal are applied to the power convertor for converting the amplified radio frequency signal into a second DC voltage. The cut-off frequency of the transistor device is then determined based on the frequency value, a ratio value corresponding to the first and the second DC voltage, and a ratio value corresponding to source and load resistance values associated with the transistor device.

According to yet another exemplary embodiment, a method of determining cut-off frequency for a transistor device within a semiconductor wafer may include forming, within a dicing street region of the semiconductor wafer, a biasing circuit for determining base current settings for the transistor device, whereby the base current settings enable a substantially linear amplification by the transistor device. Within the dicing street region of the semiconductor wafer, a radio frequency signal source may be formed for generating a radio frequency signal having a frequency value, whereby the biased transistor device generates an amplified radio frequency signal based on receiving the radio frequency signal as an input signal. Within the dicing street region of the semiconductor wafer, a power convertor may be formed that receives the radio frequency signal and generates a first DC voltage, and receives both the radio frequency signal and the amplified radio frequency signal and generates a second DC voltage. The cut-off frequency of the transistor device may then be determined based on the frequency value, a ratio value corresponding to the first and the second DC voltage, and a ratio value corresponding to source and load resistance values associated with the transistor device.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe an electronic test circuit that measures the cut-off frequency ($f_T$) of fabricated bi-polar transistor devices such as NPN bi-polar (BJT) transistor devices during the manufacturing process. Particularly, the electronic test circuit may be formed within the dicing streets of a fabricated wafer. Thus, prior to dicing the wafer into multiple semiconductor dies, the electronic test circuit is utilized for evaluating the cut-off frequency ($f_T$) of a NPN BJT device under test (DUT). The DUT may be part of the electronic test circuit and is fabricated during the same manufacturing processes as the circuitry formed on the wafer. Since the DUT is identical to or substantially similar to the NPN BJT devices formed on the wafer, therefore, determining the cut-off frequency ($f_T$) of the DUT is indicative of the $f_T$ performance of the actual manufactured NPN BJTs formed on the wafer. It may be appreciated that the following exemplary circuit and test processes may be adopted in the testing and cut-off frequency ($f_T$) determination of a myriad of different transistor devices such as, for example, PNP BJT transistors. Since the test circuit calculates cut-off frequency ($f_T$) during one or more phases of the manufacturing process (e.g., metallization layer formation, prior to dicing wafer, etc.), the test process is referred to as in-line testing.

In an alternative embodiment, the electronic test circuit may be formed within a region of each semiconductor device or die residing on the wafer. In such an implementation, the cut-off frequency ($f_T$) of a DUT may be determined post-manufacture by, for example, a customer acquiring a packaged semiconductor die. In contrast, however, by forming the electronic test circuit in the dicing street, these circuits may be destroyed during the die-cutting process.

The following describes an exemplary embodiment of the test circuit used for determining the cut-off frequency ($f_T$) of a DUT which, therefore, provides an indication of the $f_T$ parameter associated with the manufactured NPN BJT devices (e.g., IBM BiCMOS 8HP technology).

Figure 1:
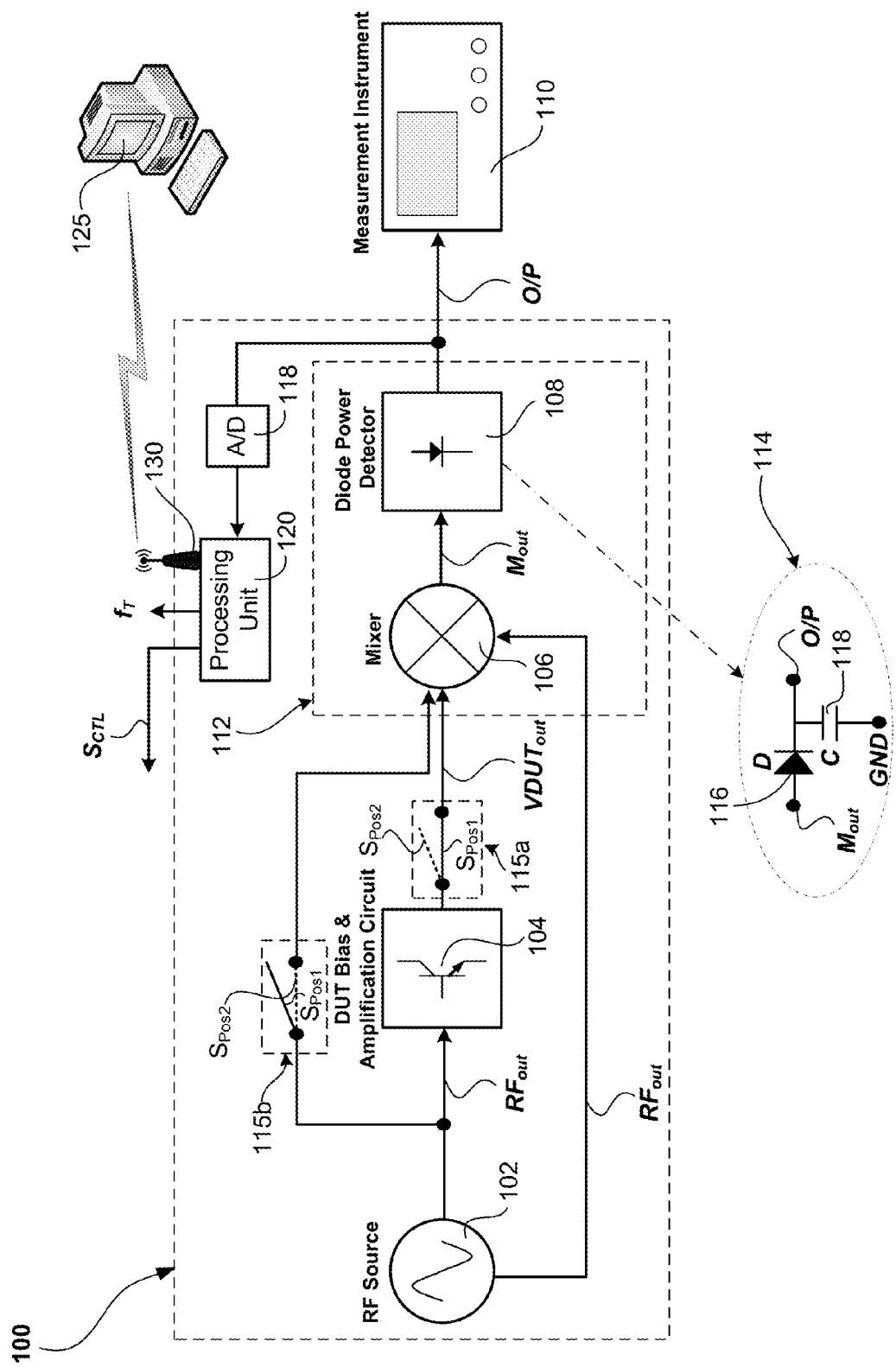
FIG. 1 is a cut-off frequency ($f_T$) test circuit according to one exemplary embodiment.

Referring to FIG. 1, an exemplary test circuit 100 is depicted. The test circuit may include a radio frequency (rf) oscillator or signal source 102, a device under test (DUT) amplification and biasing circuit 104, a frequency mixer 106, and a diode power detector 108. The output O/P of the diode power detector 108 may then be coupled to an external measurement instrument 110 such as, for example, an oscilloscope.

The rf signal source 102 may include, for example, a six-stage bipolar ring oscillator that generates an electrical signal having a frequency ($f_{osc}$) of about 1-100 GHz. The output $RF_{out}$ signal from the rf signal source 102 is coupled to the amplification and biasing circuit 104 as an input signal. The DUT is included within the amplification and biasing circuit 104 and driven by the output $RF_{out}$ signal of the rf signal source 102. More details corresponding to the amplification and biasing circuit 104 is provided in relation to the circuit implementation depicted in FIG. 2.

In response to receiving the output $RF_{out}$ signal from the rf signal source 102, the DUT within the amplification and biasing circuit 104 generates a corresponding output signal $VDUT_{out}$. The corresponding output signal $VDUT_{out}$ from the amplification and biasing circuit 104 is then frequency mixed down to a DC and AC ($2 \cdot f_{osc}$) signal components $M_{out}$ utilizing mixer 106.

As depicted, the mixer 106 also receives the $RF_{out}$ signal from the rf signal source 102 in addition to the $VDUT_{out}$ signal from the amplification and biasing circuit 104. At the mixer 106, since the received $RF_{out}$ signal and signal $VDUT_{out}$ signal have an identical frequency value based on being fed from the same signal source, the product of the mixing yields a DC signal component within the $M_{out}$ signal. As previously described, the mixer 106 may also generate an AC signal component at double the frequency of $VDUT_{out}$ and, therefore, double the $RF_{out}$ signal. However, the diode power detector 108, which may include a rectifier circuit (not shown) or a diode peak detector, can filter out the AC component and detect only DC signals. For example, the diode power detector 108 may include a diode peak detector 114 having a forward biased diode 116 and capacitor 118 acting as a low pass filter. Thus, the O/P of the power detector 108 generates a DC voltage that is proportional to the power of the $VDUT_{out}$ signal generated from the DUT device within the amplification and biasing circuit 104. At the measurement instrument 110, the DC voltage generated at the O/P of the diode power detector 108 is subsequently measured. The mixer 106 and the diode power detector 108 may collectively form rf power detector 112, which converts rf signal power to DC voltage values.

The circuit 100 of FIG. 1 also includes switch devices 115a and 115b, which are actuated during the testing operation of the circuit 100. The switching configuration (i.e., open/closed) of switches 115a and 115b are also described in the following paragraphs with reference to FIG. 3. As depicted, switch 115b provides a path that by-passes the amplification and biasing circuit 104, while switch 115a facilitates the ability to selectively isolate the output signal $VDUT_{out}$ of the amplification and biasing circuit 104 from being input to the mixer 106.

Specifically, in a first mode of operation, switch 115a may isolate the output signal $VDUT_{out}$ of the amplification and biasing circuit 104 by being in the open position, as depicted by $S_{Pos2}$. When switch 115a isolates the output signal $VDUT_{out}$ of the amplification and biasing circuit 104, switch 115b enables the RFout signal from the rf signal source 102 to by-pass the amplification and biasing circuit 104 by being in the closed position, as depicted by $S_{Pos1}$.

Alternatively, in a second mode of operation, switch 115a may couple the output signal $VDUT_{out}$ of the amplification and biasing circuit 104 to the input of the mixer 106 by being in the closed position, as depicted by $S_{Pos1}$. When switch 115a couples the output signal $VDUT_{out}$ of the amplification and biasing circuit 104, switch 115b isolates the RFout signal from by-passing the amplification and biasing circuit 104 by being in the open position, as depicted by $S_{Pos2}$.

As described in more detail below, the first mode of operation facilitates measuring the voltage magnitude of the RFout signal that is input to the amplification and biasing circuit 104, and thus, input to the transistor device under test within the amplification and biasing circuit 104. The second mode of operation facilitates measuring the voltage magnitude of the $VDUT_{out}$ signal that is output from the amplification and biasing circuit 104, and thus, input to the rf power detector 112.

The circuit of FIG. 1 may also optionally include an analog-to-digital (A/D) convertor 118 and a processing unit 120 such as a microprocessor executing a program. In operation, the O/P from the diode power detector 108 may be converted to a digital value that is processed by the processing unit 120. The processing unit 120 may include a calibration table (not shown) that scales the digitized value received from the A/D convertor 118 in order to reflect a digitized representation of the measurement equipment's 110 value. As described in more detail below, processing unit 120 includes an algorithm that receives the digitized O/P voltages from the diode power detector 108 and generates a corresponding cut-off frequency ($f_T$) value.

Figure 2:
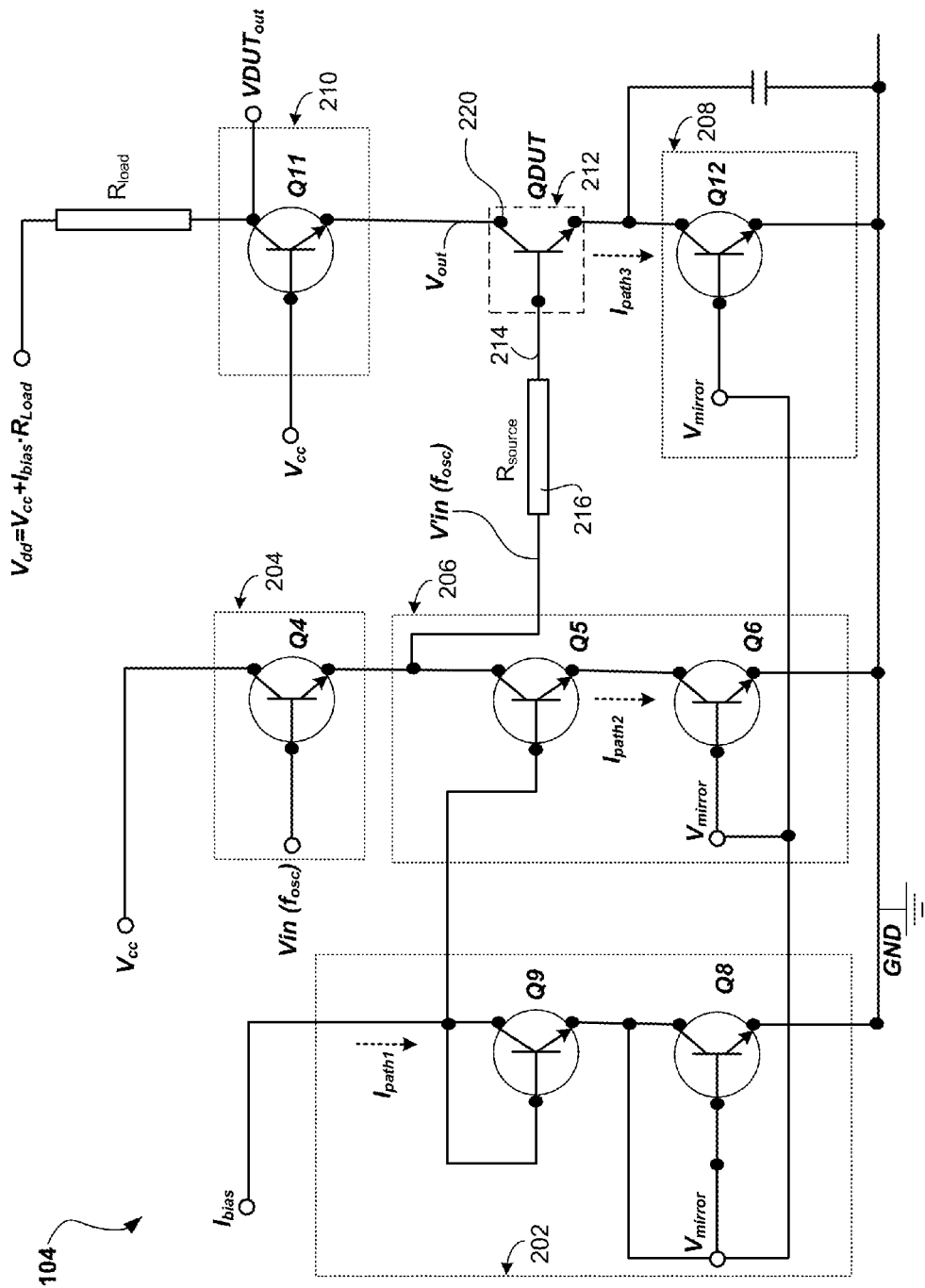
FIG. 2 is a bias and amplification circuit within the exemplary cut-off frequency ($f_T$) test circuit of FIG. 1, according to one embodiment.

Referring to FIG. 2, an exemplary embodiment of the amplification and biasing circuit 104 shown in FIG. 1 is depicted. The amplification and biasing circuit 104 may include a current mirror circuit 202, an input buffer stage 204, a cascoded current source 206, a current mirror 208, an output buffer stage 210, and an NPN transistor device under test (QDUT) 212.

The current mirror circuit 202 may include a variable current $I_{bias}$ set by any suitable current source (not shown), and transistor devices Q8 and Q9. Transistors Q8 and Q9 set the base-emitter voltage ($V_{be}$), as indicated by $V_{mirror}$, for both transistors Q6 and Q12. This may ensure that the set current $I_{bias}$ flowing along current path $I_{path1}$ through transistor devices Q8 and Q9 is according mirrored along both current path $I_{path2}$ through transistor device Q6 and current path $I_{path3}$ through transistor device Q12. Thus, transistor device Q12 sets the collector current ($I_c$) of the DUT transistor QDUT 212 to current $I_{bias}$.

The input buffer stage 204 may include emitter follower transistor Q4 having a current gain of unity. Thus, transistor Q4 receives a test signal input Vin ($f_{osc}$) that is buffered and applied to the base 214 of transistor QDUT 212 via source resistor 216 (e.g., $R_{source}$=5K). The test signal input Vin ($f_{osc}$) is received from rf signal source 102 (FIG. 1), which may generate an electrical signal RFout having a frequency ($f_{osc}$) in the range of about 1-100 GHz. In operation, the rf signal source 102 (FIG. 1) may generate one or more different frequencies (i.e., RFout signals) that is received as an input test signal Vin ($f_{osc}$) to transistor Q4. Transistor Q4 thus acts as a unity gain buffer that applies the test signal Vin ($f_{osc}$) input to transistor QDUT 212.

The cascoded current source 206 may include transistor devices Q5 and Q6. The transistor devices Q5, Q6 forming the cascoded current source 206 bias transistor Q4 of the input buffer 204 stage. Transistor devices Q5 and Q6 also set the base voltage of transistor QDUT 212. The current mirroring through transistor devices Q5 and Q6, and through transistor Q12, may provide a stable bias current (i.e., $I_{bias}$) through QDUT 212 in order to bias QDUT 212 for providing amplification using an appropriate quiescent operating point (Q-point). Particularly, for non-distorted (e.g., unclipped) bipolar transistor device amplification, the base current of the transistor device QDUT 212 may be biased over the linear region of the transistor characteristic curves (i.e., plot of collector current against collector-emitter voltage).

The output buffer stage 210 may include a common base amplifier mode transistor Q11 also having a current gain of unity. Accordingly, transistor Q11 generates the $VDUT_{out}$ signal generated by buffering the output signal $V_{out}$ taken across the collector 220 terminal of transistor QDUT 212. The voltage at the collector 220 of transistor QDUT 212 varies in response to the buffered test signal V'in ($f_{osc}$) applied to the base 214 of the transistor QDUT 212 via source resistor 216 (e.g., $R_{source}$=5K). Thus, the generated $VDUT_{out}$ signal is generated based on the voltage variation that occurs across load resistor 222 (e.g., $R_{load}$=1K) when the voltage at the collector 220 of transistor QDUT 212 changes in response to the buffered test signal Vin ($f_{osc}$) applied to base 214 of transistor QDUT 212.

Based on the configuration of circuits 100 (FIG. 1) and 104 (FIG. 2), the cut-off frequency ($f_T$) of QDUT 212 is given by the following equation, whereby:

$$fT = |H_{21}| \cdot f_{OSC} = \frac{\frac{VDUT_{out}}{R_{load}}}{\frac{V_{in}(f_{osc})}{R_{source}}} \cdot f_{OSC} = \frac{VDUT_{out}}{V'_{in}(f_{osc})} \cdot \frac{R_{source}}{R_{load}} \cdot f_{OSC} \quad \text{Equation (1)}$$

As indicated by the above equation, the cut-off frequency ($f_T$) may be approximated without the need for determining, for example, parasitic elements such as the $C_{pi}$, $C_{be}$, and $C_{cb}$ of the transistor device under test QDUT 212. The measurement of such parasitic parameters may require complex and expensive test set-ups, which as described above and indicated by the above equation, may be mitigated. Specifically, the exemplary test circuit 100 (FIG. 1) and corresponding amplification and biasing circuit 104 (FIG. 2) enables the determination of cut-off frequency ($f_T$) values based on ratios. These ratios may include, for example, the ratio between the voltage corresponding to the buffered output $VDUT_{out}$ of transistor QDUT 212 and the voltage of the rf signal Vin ($f_{osc}$) that is applied to the input buffer stage 204 (i.e., transistor Q4), and, for example, the ratio between the source resistance $R_{source}$ and load resistance $R_{load}$ associated with transistor QDUT 212. Moreover, the cut-off frequency ($f_T$) values may be determined based on the frequency ($f_{osc}$) of the input rf signal Vin ($f_{osc}$) from the rf signal source 102 (FIG. 1). As such, the exemplary test circuit 100 (FIG. 1) and corresponding amplification and biasing circuit 104 (FIG. 2) embodiments may accordingly simplify the determination of cut-off frequency ($f_T$).

For example, the ratio between the source resistance $R_{source}$ and load resistance $R_{load}$ associated with transistor QDUT 212 alleviates any process variations during the formation of the $R_{source}$ and $R_{load}$ resistances within the semiconductor wafer. For instance, process-based changes that vary the resistance value may have the same effect on both source resistance $R_{source}$ and load resistance $R_{load}$ and, therefore, substantially cancel out. Similarly, regarding the ratio of the voltage corresponding to the buffered output $VDUT_{out}$ of transistor QDUT 212 and the voltage of the rf signal Vin ($f_{osc}$) that is applied to the input buffer stage 204 (i.e., transistor Q4), for example, any noise component that may affect one voltage (e.g., voltage of the rf signal Vin) will have the same affect on the other voltage (e.g., voltage of buffered output $VDUT_{out}$). Thus, the noise components may cancel out.

According to one numerical example, the input rf signal Vin ($f_{osc}$) may have a voltage amplitude of 224 mV, as detected by the diode power detector 108 (FIG. 1) and determined by measurement instrument 110. The buffered output $VDUT_{out}$ of transistor QDUT 212 may have a voltage amplitude of 1.85V, as detected by the rf power detector 112 (FIG. 1) and determined by measurement instrument 110. However, the rf power detector 112 (FIG. 1) may exhibit a 1.35V DC signal level when no rf signals are received. This 1.35V DC signal level may be calibrated out (i.e., subtracted from) of the detected 1.85V signal that is generated from the buffered output $VDUT_{out}$ of transistor QDUT 212. The source resistance $R_{source}$ may be designed to be 4.8 kΩ, while the load resistance $R_{load}$ may be 800Ω. The rf source frequency value (i.e., $f_{osc}$) may be 16 GHz. Inserting these values into the cut-off frequency ($f_T$) equation (i.e., Equation 1) above may yield the following results:

$$fT = |H_{21}| \cdot f_{OSC} = \frac{\frac{VDUT_{out}}{R_{load}}}{\frac{V_{in}(f_{osc})}{R_{source}}} \cdot f_{OSC} = \frac{1.85-1.35}{0.225} \cdot \frac{4800}{800} \cdot 16 \cdot 10^9 \approx 213 \text{ Ghz}$$

Figure 3:
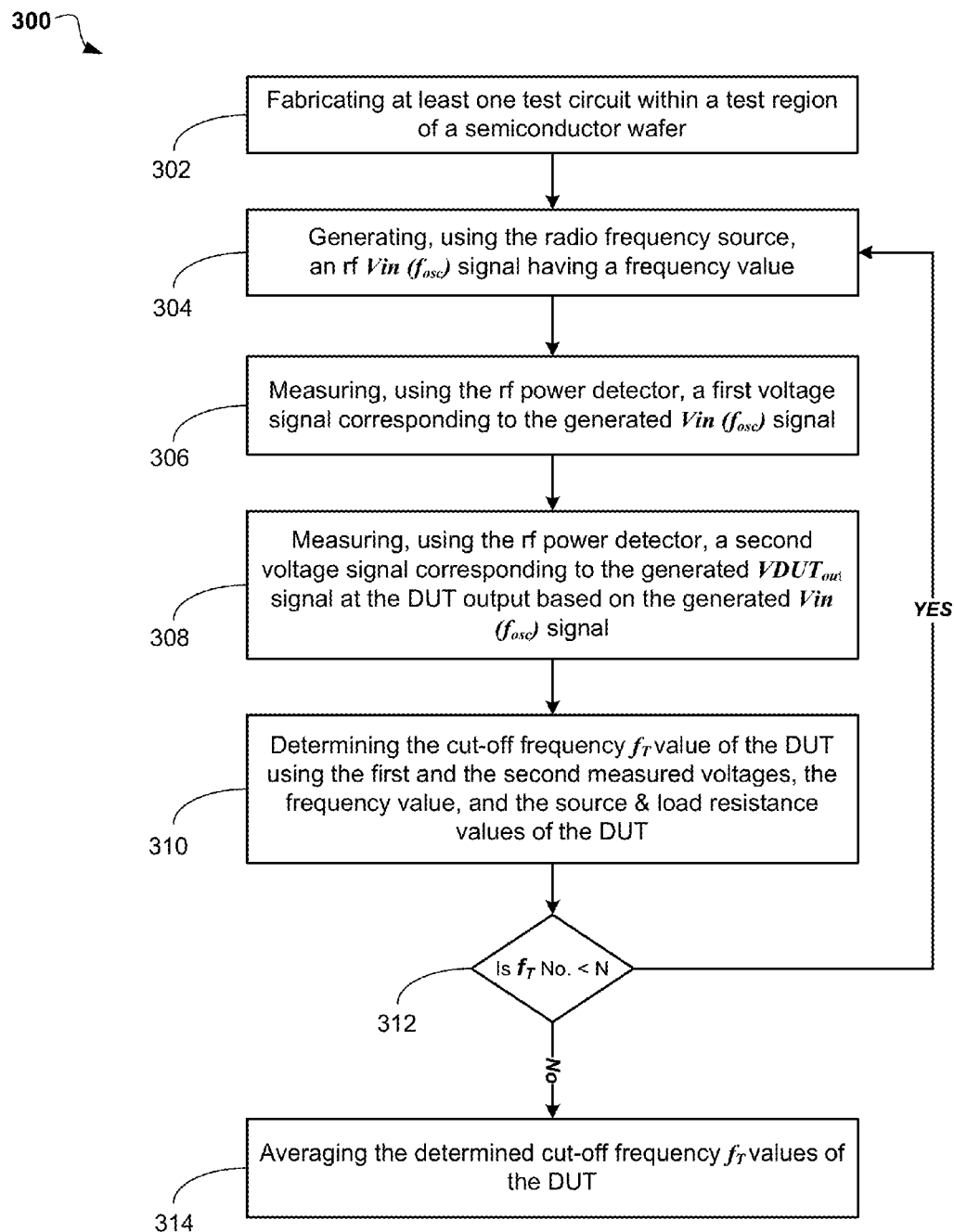
FIG. 3 is an operational flow diagram of a method of testing the cut-off frequency ($f_T$) of a transistor device under test using the exemplary test circuit of FIG. 1, according to one embodiment.
Figure 4:
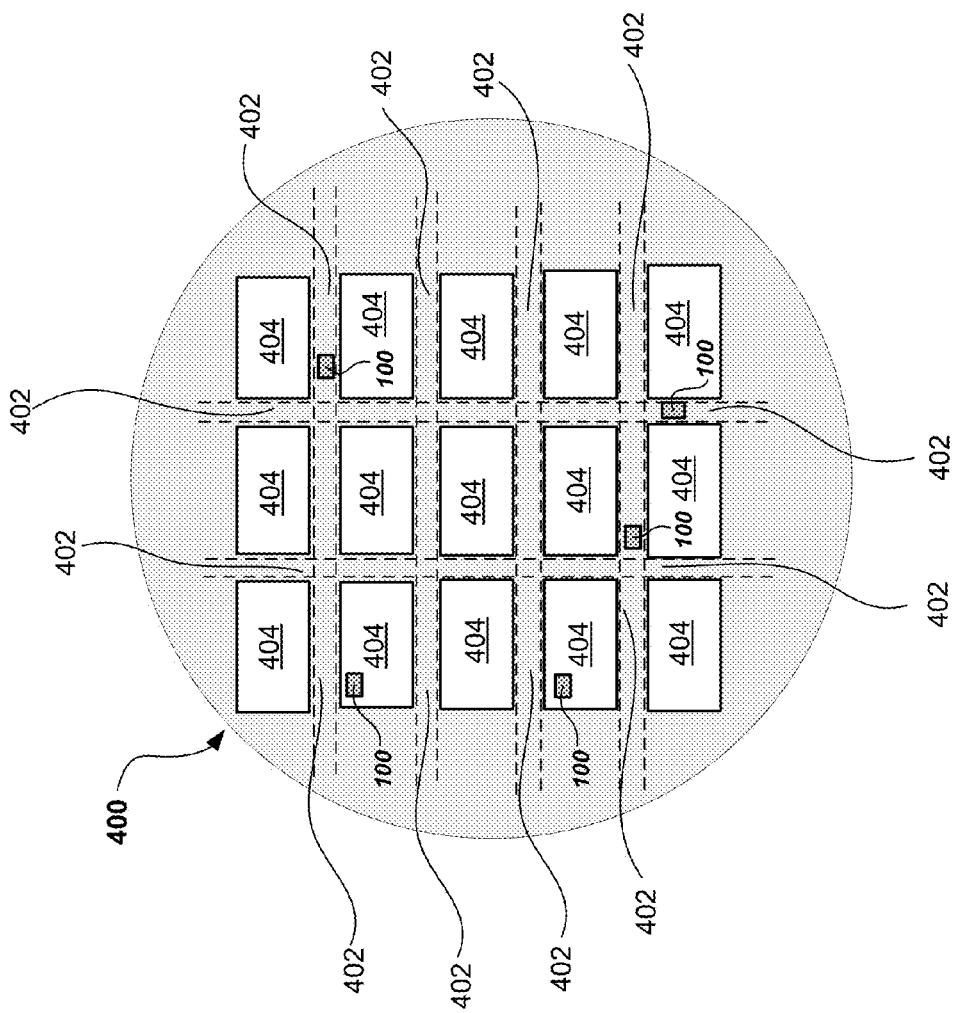
FIG. 4 depicts a semiconductor wafer having a cut-off frequency ($f_T$) test circuit embodiment.

FIG. 3 depicts an operational flow diagram 300 of a method of testing the cut-off frequency ($f_T$) of a transistor device under test using the exemplary test circuit 100 embodiment of FIG. 1. FIG. 3 is described with the aid of FIGS. 1, 2, and 4. At 302, at least one test circuit may be fabricated within a test region of a semiconductor wafer. Referring to FIG. 4, for example, a semiconductor wafer 400 may include dicing streets 402 that may be used to fabricate one or more test circuits such as test circuit 100 (FIG. 1). In an alternative implementation, for example, one or more test circuits such as test circuit 100 (FIG. 1) may be formed within a region of the semiconductor devices 404 fabricated on the wafer 400.

In the former case, where the one or more test circuits are fabricated within the dicing streets 402, following the dicing of the wafer 400, the one or more test circuits are destroyed. Thus, the test information associated with determining the cut-off frequency ($f_T$) is obtained prior to the dicing process. In the later case, however, whereby the one or more test circuits are fabricated within the semiconductor devices 404, following the dicing of the wafer 400, the one or more test circuits are preserved. Therefore, test information associated with determining the cut-off frequency ($f_T$) may be obtained prior to dicing and throughout the lifetime of the semiconductor devices 404 following the dicing process.

At 304, the rf signal source 102 (FIG. 1) generates an rf signal $RF_{out}$ having a frequency value (e.g., 16 GHz) anywhere in the range of, for example, 1-100 GHz. At 306, the rf power detector 112 (FIG. 1) detects the generated rf signal $RF_{out}$ that would be received by input buffer stage 204 (FIG. 2: transistor Q4) as signal Vin ($f_{osc}$). This signal $RF_{out}$ is detected by the diode rf power detector 112 (FIG. 1) based on configuring switch 115a (FIG. 1) to an open position $S_{pos2}$ and switch 115b (FIG. 1) to a closed position $S_{pos2}$. Thus, the $RF_{out}$ signal by-passes the amplification and biasing circuit 104 (FIG. 1) and is applied to the rf power detector 112 (FIG. 1). For example, the measurement instrument 110 (FIG. 1) may determine the detected $RF_{out}$ signal to have a voltage amplitude of 224 mV. In an alternative implementation, however, the $RF_{out}$ signal that is applied to the rf power detector 112 (FIG. 1) may be detected by the rf power detector 112 (FIG. 1), and measured by the A/D convertor 118 (FIG. 1) and processing unit 120 (FIG. 1). As previously described, the A/D convertor 118 may digitize the voltage output from the rf power detector 112 (FIG. 1), while the processing unit 120 converts (e.g., scaling) the digitized voltage to an actual measured voltage value. In both cases, the power of the rf signal $RF_{out}$ is converted to a DC voltage and measured.

At 308, the output $V_{out}$ (FIG. 2) of transistor QDUT 212 (FIG. 2) is buffered to generate signal $VDUT_{out}$ (FIG. 2: Q11). The buffered output signal $VDUT_{out}$ (FIG. 2) is then detected by the rf power detector 112 (FIG. 1) based on configuring switch 115a (FIG. 1) to a closed position $S_{pos1}$ and switch 115b (FIG. 1) to an open position $S_{pos1}$. Thus, based on the switch positions, the $RF_{out}$ signal is directly received (i.e., not by-passed) by the input buffer stage 204 (FIG. 2: transistor Q4) of the amplification and biasing circuit 104 (FIG. 2) as input signal Vin($f_{osc}$). Upon amplification of the buffered input signal V'in ($f_{osc}$) by QDUT 212 (FIG. 2), the amplified output signal $V_{out}$ (FIG. 2) is then buffered to generate buffered output signal $VDUT_{out}$ (FIG. 2). The buffered output signal $VDUT_{out}$ (FIG. 2) that is detected by the rf power detector 112 (FIG. 1) may generate a 1.85V DC signal that may be determined by measurement instrument 110 (FIG. 1).

As previously described, the rf power detector 112 (FIG. 1) may exhibit a 1.35V DC signal level when no rf signals are received. This 1.35V DC signal level may be calibrated out (i.e., subtracted from) of the detected voltage signal amplitude of 1.85V that is generated from the buffered output $VDUT_{out}$ (FIG. 2) of transistor QDUT 212 (FIG. 2). In an alternative implementation, however, the $VDUT_{out}$ (FIG. 2) signal that is applied to the rf power detector 112 (FIG. 1) may be detected by the rf power detector 112 (FIG. 1), and measured by the A/D convertor 118 (FIG. 1) and processing unit 120 (FIG. 1). As previously described, the A/D convertor 118 may digitize the voltage output from the rf power detector 112 (FIG. 1), while the processing unit 120 (FIG. 1) converts (e.g., scaling) the digitized voltage to an actual measured voltage value. In both cases, the power of the $VDUT_{out}$ (FIG. 2) is converted to a DC voltage and measured.

At 310, a cut-off frequency value ($f_T$) is calculated based on, inserting into Equation (1) above, the measured DC voltage corresponding to $VDUT_{out}$ (i.e., 1.85V–1.35V), the measured voltage corresponding to the generated rf signal $RF_{out}$ (i.e., 224 mV), the $RF_{out}$ frequency value (i.e., $f_{osc}$=16 GHz), and the source and load resistance values $R_{source}$, $R_{load}$ (i.e., 4.8 kΩ, 800Ω) associated with transistor QDUT 212 (FIG. 2). As previously determined in the above numerical example, the cut-off frequency value ($f_T$) is calculated to be about 213 GHz.

The cut-off frequency value ($f_T$) may be calculated multiple times at different $RF_{out}$ frequency values (e.g., $f_{osc}$=8 GHz and $f_{osc}$=16 GHz). At 312, if the number of ($f_T$) values calculated are less than a predetermined number (i.e., N), the $RF_{out}$ frequency is varied and processes 304-310 are repeated in order to recalculate the cut-off frequency values ($f_T$) at the different $RF_{out}$ frequency values. The calculated ($f_T$) values from processes 304-310 may then be averaged to generate a single ($f_T$) value (314).

The processing unit 120 (FIG. 1) may include an executable program that calculates cut-off frequency values ($f_T$) according to the mathematical relationship of equation (1). Accordingly, the A/D convertor 118 (FIG. 1) provides the processing unit 120 (FIG. 1) with the digitized values associated with the voltage outputs from the rf power detector 112 (FIG. 1), whereby a first digitized value may correspond to the rf signal $RF_{out}$ and a second digitized value may correspond to $VDUT_{out}$ (FIG. 2). Using the processing unit 120, the first and the second digitized values may be scaled to represent voltage values that correspond to the rf signal $RF_{out}$ and $VDUT_{out}$ (FIG. 2) signal detected by the rf power detector 112 (FIG. 1). For example, the A/D convertor 118 and processing unit 120 may perform the same voltage detection operation as the measurement instrument 110, thereby alleviating a need for an external measurement device or system. Moreover, the processing unit 120 may both set and log the frequency value of the rf signal $RF_{out}$ generated by rf source 102 (FIG. 1). Using the stored resistance values for both the source and the load resistors $R_{source}$, $R_{load}$, the frequency value of the rf signal $RF_{out}$, and the voltage values that correspond to the rf signal $RF_{out}$ and $VDUT_{out}$ (FIG. 2), the processing unit 120 (FIG. 1) may calculate cut-off frequency values ($f_T$) for the DUT.

The processing unit 120 (FIG. 1) may also actuate the position of the switches 115a, 115b (FIG. 1) via switch control output $S_{CTL}$ (FIG. 1) based on the process 300 described above and depicted in FIG. 3. In some implementations, the processing unit 120 (FIG. 1) may further include an embedded transmitter/receiver device 130 (FIG. 1) capable of, for example, providing Bluetooth or Wi-Fi wireless operation. In such an implementation, once the processing unit 120 (FIG. 1) calculates one or more cut-off frequency values ($f_T$) for the DUT, these values may be wirelessly transmitted to a user or a test evaluation computer 125 (FIG. 1) via embedded transmitter/receiver device 130 (FIG. 1).

The above described determination of the cut-off frequency value ($f_T$) of a DUT of a test circuit fabricated within the dicing streets may occur before the back-end-of-the-line (BEOL) formation and/or prior to dicing the wafer into individual semiconductor devices. However, if the test circuit is integrated within the individual semiconductor devices, the cut-off frequency value ($f_T$) of the DUT may be determined before the back-end-of-the-line (BEOL) formation, prior to dicing the wafer into individual semiconductor devices, and/or during in-field testing once the semiconductor device is operational.

Moreover, the cut-off frequency value ($f_T$) of the DUT may be determined under different biasing conditions using the exemplary process depicted in operational flow diagram 300 and described above. For example, referring to FIG. 2, the bias current value of QDUT 212 may be set utilizing the $I_{bias}$ setting. Additionally, adjusting the $V_{cc}$ and $V_{dd}$ may also contribute to varying the bias current value of QDUT 212.

Although the above described rf signal source generates an electrical signal having a frequency ($f_{osc}$) of about 1-100 GHz, it may be appreciated that based on the technology (e.g., CMOS, BiCMOS, etc.) of the transistor devices being measured, the rf source may be configured to generate a different range of frequencies. Moreover, based on the technology (e.g., CMOS, BiCMOS, etc.) of the transistor devices being measured, a different range of bias current may be set within the biasing circuit.

Figure 5:
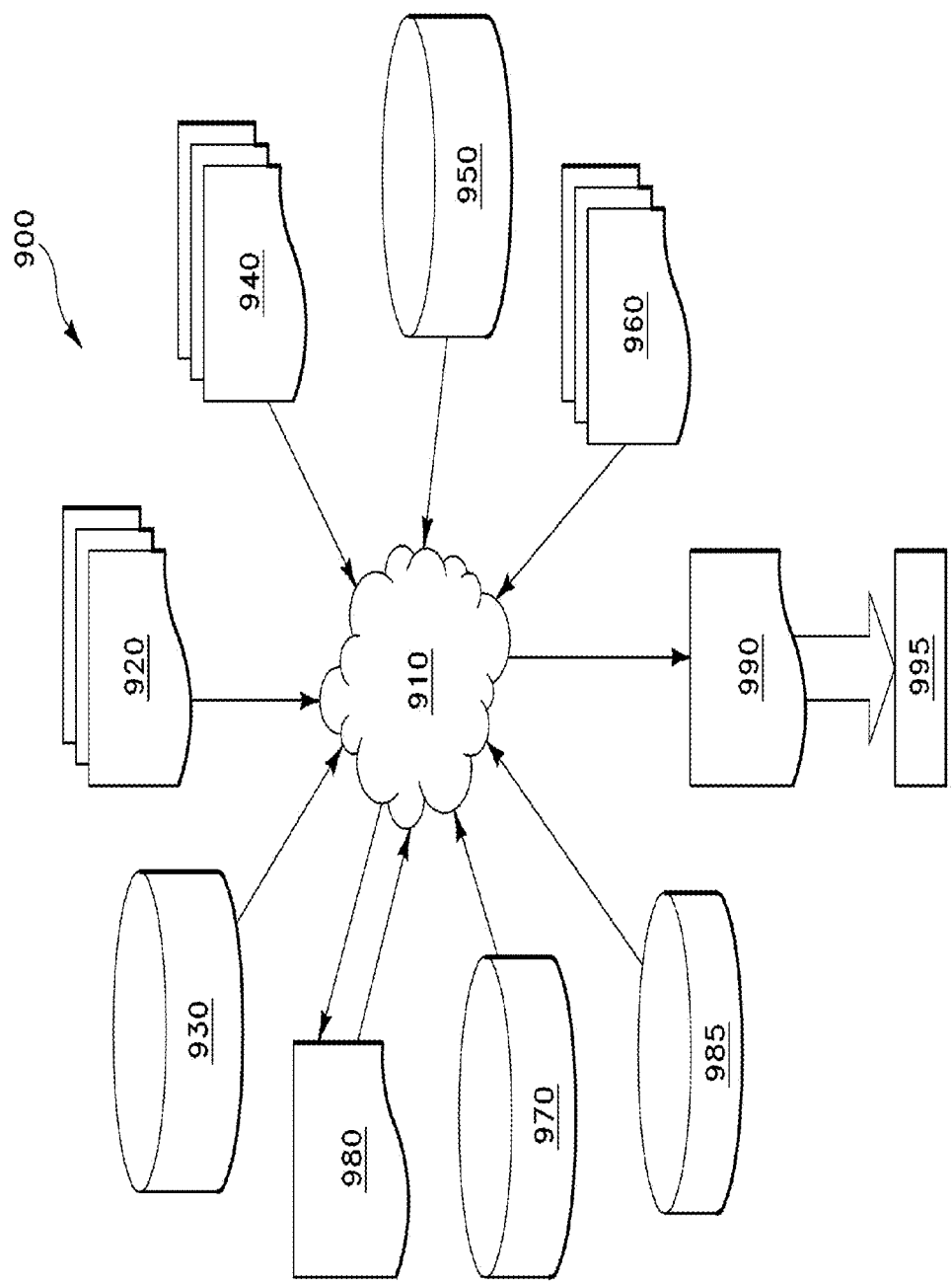
FIG. 5 is a flow diagram of a design process used in semiconductor design, manufacture, and/or test according to an exemplary embodiment.

FIG. 5 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1 and 2. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. In one embodiment, the design structure 920 comprises design data used in a design process and comprising information describing the embodiments of the invention with respect to the structures as shown in FIG. 1. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiment of the invention shown in FIGS. 1 and 2. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 1 and 2 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A test circuit within a semiconductor wafer that measures a cut-off frequency for a transistor device under test, the test circuit comprising:
    a region of the semiconductor wafer;
    a radio frequency signal source, located within the region, that generates a radio frequency signal;
    a biasing circuit, located within the region, that provides a current bias setting to the transistor device under test, the biasing circuit receiving the radio frequency signal, buffering the radio frequency signal to generate a buffered radio frequency signal and applying the buffered radio frequency signal to the transistor device under test, the transistor device under test generating a first output signal in response to the buffered radio frequency signal and the biasing circuit further buffering the first output signal to generate a buffered output signal; and
    an rf power detector, located within the region, that receives the buffered output signal and the radio frequency signal, and generates an output voltage signal, the cut-off frequency of the transistor device under test being determined from the output voltage signal.

2. The test circuit of claim 1, the region comprising dicing streets associated with the semiconductor wafer.

3. The test circuit of claim 1, the region comprising a location within each semiconductor die within the semiconductor wafer.

4. The test circuit of claim 1, the transistor device under test comprising a NPN transistor.

5. The test circuit of claim 1, the radio frequency signal source comprising a six-stage bipolar ring oscillator circuit.

6. The circuit of claim 1, the radio frequency signal having a frequency of about 1-100 GHz.

7. A test circuit within a semiconductor wafer that measures a cut-off frequency for a transistor device under test, the test circuit comprising:
    a region of the semiconductor wafer;
    a radio frequency signal source, located within the region, that generates a radio frequency signal;
    a biasing circuit, located within the region, that provides a current bias setting to the transistor device under test, the biasing circuit receiving the radio frequency signal, buffering the radio frequency signal to generate a buffered radio frequency signal and applying the buffered radio frequency signal to the transistor device under test, the transistor device under test generating a first output signal in response to the buffered radio frequency signal and the biasing circuit further buffering the first output signal to generate a buffered output signal; and
    an rf power detector, located within the region, that receives the buffered output signal and the radio frequency signal, and generates an output voltage signal, the cut-off frequency of the transistor device under test being determined from the output voltage signal, the rf power detector comprising:
    a mixer, located within the region, that receives the buffered output signal and the radio frequency signal, and generates a second output signal; and
    a diode power detector that receives the second output signal from the mixer and generates the output voltage signal.

8. The test circuit of claim 7, the biasing circuit comprising a current mirror circuit that sets the bias current that is applied to a base of the transistor device under test.

9. The test circuit of claim 8, the bias current being about 1μ, to about 10 mA.

10. The test circuit of claim 8, the biasing circuit comprising an input buffer having a current gain of unity, the input buffer receiving the radio frequency signal, buffering the radio frequency signal to generate the buffered radio frequency signal and applying the buffered radio frequency signal to the base of the transistor device under test.

11. The test circuit of claim 10, the biasing circuit comprising an output buffer having a current gain of unity, the output buffer comprising an emitter, a collector and an output node electrically connected to collector, the emitter receiving the first output signal from the transistor device under test and the buffered output signal being output at the output node.

12. The test circuit of claim 11, the biasing circuit comprising:
    a source resistor having an input and an output, the input receiving the buffered radio frequency signal and the output coupling to the base of the transistor device under test; and
    a load resistor coupled to the collector of the output buffer.

13. The test circuit of claim 12, the cut-off frequency of the transistor device under test being derived from:
- a ratio of a resistance value corresponding to the source resistor to a resistance value corresponding to the load resistor;
- a ratio of an amplitude value corresponding to the buffered output signal and an amplitude value corresponding to the buffered radio frequency signal; and
- a frequency value corresponding to the radio frequency signal.

14. A method of determining a cut-off frequency for a transistor device in a test circuit located within a region of a semiconductor wafer, the method comprising:
- generating, by a radio frequency signal source of the test circuit, a radio frequency signal;
- biasing, by a biasing circuit of the test circuit, the transistor device for enabling a substantially linear amplification and,
- receiving, by the biasing circuit, the radio frequency signal;
- buffering, by the biasing circuit, the radio frequency signal to generate a buffered radio frequency signal;
- applying, by the biasing circuit to the transistor device when the transistor device is biased, the buffered radio frequency signal;
- generating, by the transistor device in response to the buffered radio frequency signal, a first output signal;
- buffering, by the biasing circuit, the first output signal to generate a buffered output signal;
- receiving, by an rf power detector of the test circuit, the buffered output signal and the radio frequency signal; and,
- generating, by the rf power detector, an output voltage signal, the cut-off frequency of the transistor device being determined from the output voltage signal.

15. The method of claim 14, the region comprising dicing streets.

16. The method of claim 14, the region comprising a location within a semiconductor device fabricated on the semiconductor wafer.

17. The method of claim 14, the transistor device comprising an NPN bipolar transistor device.

18. The method of claim 14, the biasing of the transistor device comprising: applying a base current of about 1μ to about 10 mA to the transistor device.

19. The method of claim 14, the radio frequency signal having a frequency of about 1-100 GHz.

20. The method of claim 14, the generating of the output voltage signal comprising:
- receiving, by a mixer of the rf power detector, the buffered output signal and the radio frequency signal; and,
- generating, by the mixer, a second output signal;
- receiving, by a diode power detector of the rf power detector, the second output signal from the mixer; and,
- generating, by the diode power detector, the output voltage signal.

* * * * *